United States Patent [19]
Higashi et al.

[11] Patent Number: 5,438,223
[45] Date of Patent: * Aug. 1, 1995

[54] ANISOTROPIC ELECTRICALLY CONDUCTIVE ADHESIVE FILM AND CONNECTION STRUCTURE USING THE SAME

[75] Inventors: Kazumi Higashi; Amane Mochizuki; Masako Maeda, all of Osaka, Japan

[73] Assignee: Nitto Denko Corporation, Osaka, Japan

[*] Notice: The portion of the term of this patent subsequent to Aug. 4, 2009 has been disclaimed.

[21] Appl. No.: 30,865

[22] Filed: Mar. 12, 1993

[30] Foreign Application Priority Data

Mar. 13, 1992 [JP]  Japan .................. 4-090044
Mar. 13, 1992 [JP]  Japan .................. 4-090045

[51] Int. Cl.⁶ .................. H01L 23/48; H01L 29/40; H01L 29/44; A01L 29/52
[52] U.S. Cl. .................. 257/774; 257/734; 257/780; 257/775
[58] Field of Search .............. 257/774, 737, 758, 780, 257/734, 775

[56] References Cited

U.S. PATENT DOCUMENTS

| | | | |
|---|---|---|---|
| 4,323,914 | 4/1982 | Berndlmaier et al. | 257/713 |
| 4,970,571 | 11/1990 | Yamakawa et al. | 257/737 |
| 5,014,111 | 5/1991 | Tsuda et al. | 257/737 |
| 5,027,188 | 6/1991 | Owada et al. | 257/758 |
| 5,136,359 | 8/1992 | Takayama et al. | 257/776 |
| 5,232,702 | 8/1993 | Pfister et al. | 424/448 |

FOREIGN PATENT DOCUMENTS

| | | |
|---|---|---|
| 0223464 | 5/1987 | European Pat. Off. . |
| 0344702 | 12/1989 | European Pat. Off. . |
| 0475022 | 3/1992 | European Pat. Off. . |
| 4113954 | 10/1991 | Germany . |
| 5463200 | 4/1979 | Japan . |
| 55-161306 | 12/1980 | Japan . |
| 62-43008 | 2/1987 | Japan . |
| 63-40218 | 2/1988 | Japan . |
| 63-94504 | 4/1988 | Japan . |
| 3266306 | 11/1991 | Japan . |
| 8907337 | 8/1989 | WIPO . |

*Primary Examiner*—Robert P. Limanek
*Assistant Examiner*—Teresa M. Arroyo
*Attorney, Agent, or Firm*—Sughrue, Mion, Zinn, Macpeak & Seas

[57] ABSTRACT

An anisotropic electrically conductive adhesive film having fine through holes independently electroconductively passing through an insulating film in the thickness direction, at least one end portion of both the end portions of the each through hole on the front and back surfaces of said film being blocked with a bump-form metal projection having a larger base area than the area of the opening portion of the through hole, wherein the insulating film comprises a thermoplastic polyimide resin having a melt viscosity at 400° C. of not higher than $1 \times 10^8$ poise is disclosed. The film is interposed between materials to be connected to provide a connection structure.

16 Claims, 4 Drawing Sheets

ANISOTROPIC ELECTRICALLY CONDUCTIVE ADHESIVE FILM AND CONNECTION STRUCTURE USING THE SAME

FIELD OF THE INVENTION

The present invention relates to an anisotropic electrically conductive film and a connection structure using the film.

FIELD OF THE INVENTION

Recently, with multi-functioning, down-sizing, and light-weighing electronic instruments, patterns of wiring circuits are highly integrated and multi-pin and narrow-pitched fine patterns are employed in the field of semiconductors. For meeting such a requirement for fine circuit patterns, a method of interposing an anisotropic electrically conductive adhesive film in the connection of plural electrically conductive patterns formed on a substrate and other electrically conductive pattern(s) or IC (integrated circuit), LSI (large scale integration), etc., has been attempted.

For example, JP-A-55-161306 (the term "JP-A" as used herein means an "unexamined published Japanese patent application") discloses a sheet rendered anisotropically electroconductive by applying metal plating to the pores in selected regions of an insulating porous sheet. However, since there are no metal projections on the surface of such a sheet, at connecting the sheet to IC, etc., it is required to form projected electrodes (bumps) at the connecting pad portions of the IC side, which makes the connection step complicated.

JP-A-62-43008, JP-A-63-40218, and JP-A-63-94504 disclose a film rendered anisotropically electroconductive by filling a metallic substance in microholes formed in an insulating film in the thickness direction and further the metallic substance is projected in a bump form to facilitate the connection with IC, etc. Further, JP-A-54-63200 discloses a film rendered anisotropically conductive by orienting many electrical conductors in an insulating film in the thickness direction and forming an adhesive layer on both surfaces of the film for improving the workability thereof.

However, since the metallic substance filled in the anisotropic electrically conductive film generally has the structure as shown in FIG. 9 of the accompanying drawings, the adhesive property of the metallic substance filled to the insulating film is insufficient and hence there is a possibility that the metallic substance falls off, whereby the fine pores which must essentially have an electrical conductivity lose the conductivity to lack the reliability for the electrical connection.

As shown in FIG. 10, an anisotropic electrically conductive adhesive film formed by dispersing an electrically conductive powder 12 in a binder 13 comprising a thermoplastic resin or a thermosetting resin having an adhesive property is known. However, when materials to be connected are connected to each other using the adhesive film, there is a possibility that the electrically conductive powder 12 dispersed in the binder 13 flows by pressing or heating to cause a poor anisotropic electroconductivity and a poor connection. Furthermore, when the adhesive film is used to mount a semiconductor such as IC, LSI, etc., for driving a liquid crystal display, the film does no sufficiently function as the sealing material at the mounted portion since the film is lacking in a sufficient self-supporting property (form-holding property), and hence the film is yet insufficient for practical use. Also, the conventional adhesive sheet is reluctant to apply for a heat resistant use due to the poor heat resistance.

SUMMARY OF THE INVENTION

As a result of various investigations to overcome the above-described problems in conventional anisotropic electrically conductive films and to provide an anisotropic electrically conductive adhesive film having a certain anisotropic electroconductivity and a high reliability for connection and capable of surely sealing the connected portion by the high adhesive property, the inventors have succeeded in accomplishing the present invention.

That is, according to the 1st embodiment of the present invention, there is provided an anisotropic electrically conductive adhesive film having fine through holes independently electroconductively passing through an insulating film in the thickness direction, at least one end portion of both the end portions of the each through hole on the front and back surfaces of the film being blocked with a bump-form metallic projection having a larger base area than the area of the opening portion of the through hole, wherein the insulating film comprises a thermoplastic polyimide resin having a melt viscosity of not higher than $1 \times 10^8$ poise at 400° C.

According to the 2nd embodiment of the present invention, there is provided an anisotropic electrically conductive adhesive film having fine through holes independently electroconductively passing through an insulating film in the thickness direction, at least one end portion of both the end portions of the each through hole on the front and back surfaces of the film being blocked with a bump-form metallic projection having a larger base area than the area of the opening portion of the through hole, wherein a thermoplastic polyimide resin layer having a melt viscosity of not higher than $1 \times 10^8$ poise at 400° C. is formed on at least one surface of the insulating film.

According to 3rd embodiment of the present invention, there is provided a connection structure wherein the above-described each anisotropic electrically conductive adhesive film is interposed between materials to be connected.

DETAILED DESCRIPTION OF THE INVENTION

The present invention is described in detail by referring to the accompanying drawings.

An anisotropic electrically conductive film of the structure having fine through holes independently electroconductively passing through an insulating film in the thickness direction, at least one end portion of both the end portions of the each through hole being blocked with a bump-form metal projection having a larger base area than the area of the opening portion of the through hole has been already proposed by the inventors in U.S. Pat. No. 5,136,359 and the present invention relates to an improvement thereof.

Figure 1:
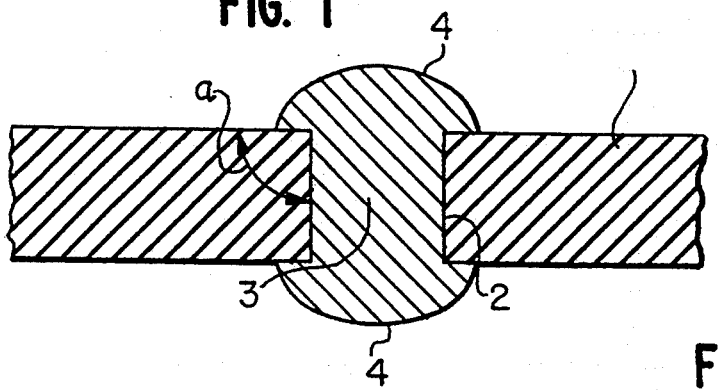
FIG. 1 is an enlarged cross sectional view showing one embodiment of the anisotropic electrically conductive film of the present invention, wherein the insulating film itself has a heat adhesive property.

FIG. 1 is an enlarged cross sectional view showing an embodiment of the anisotropic electrically conductive adhesive film of the present invention wherein the insulating film itself has a heat adhesive property.

As shown in FIG. 1, a fine through hole 2 is formed in an insulating film 1 in the thickness direction and an electroconductive path reaching the front surface and the back surface of the insulating film is formed by filling the through hole 2 with a metallic substance. At both the end portions of the through hole 2 are formed bump-form metal projections 4,4 each having a larger base area than the area of the opening portion of the through hole 2 and the metal projections block the through hole 2 in a so-called rivet form.

Figure 2:
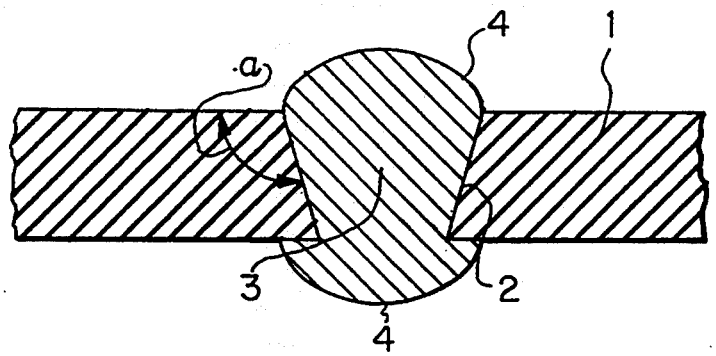
FIG. 2 is an enlarged cross sectional view showing another embodiment of the anisotropic electrically conductive film of the present invention, wherein the insulating film itself has a heat adhesive property.
Figure 9:
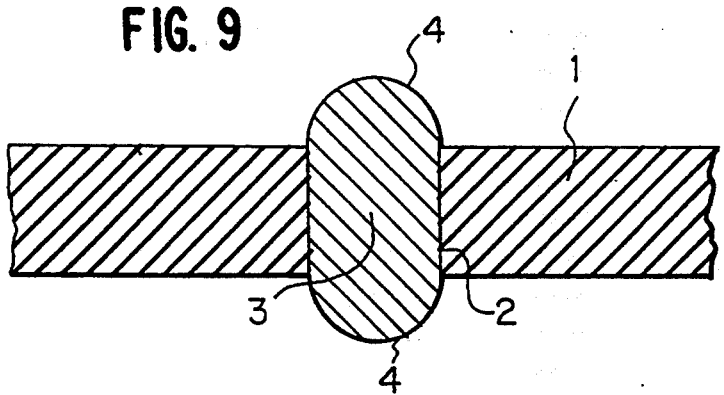
FIG. 9 is an enlarged cross sectional view showing embodiment of a conventional anisotropic electrically conductive adhesive film.
Figure 10:
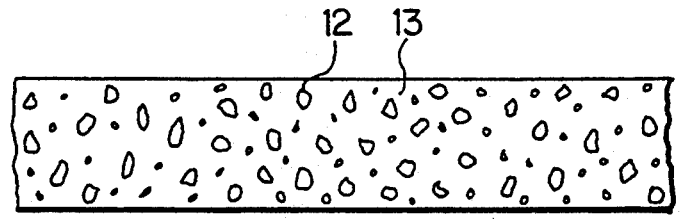
FIG. 10 is an enlarged cross sectional view showing another embodiment of a conventional anisotropic electrically conductive adhesive film.

FIG. 2 is an enlarged cross sectional view showing another embodiment of the anisotropic electrically conductive adhesive film of the present invention, wherein the insulating film itself has a heat adhesive property and a bump-form metal projection 4 having a larger and base area than the area of the opening portion of the through hole 2 at one end portion only of the through hole 2 formed in the insulating film 1 is formed.

The diameter of the fine through hole 2 formed can be desirably selected according to the purpose of use of the anisotropic electrically conductive film, but is usually from 15 to 100 μm, and preferably from 20 to 50 μm, and the pitch of the fine through holes is from 15 to 200 μm, and preferably from 40 to 100 μm.

In the anisotropic electrically conductive adhesive films of the present invention having the structures shown in FIG. 1 and FIG. 2 described above, the insulating film 1 comprises a specific thermoplastic polyimide resin having an adhesive property, and each of these adhesive films can melt-adhere to materials to be connected by heat-press adhesion to surely seal the connected portions. As the resin showing an adhesive property by heating, a thermoplastic polyimide resin having a melt viscosity of not higher than $1 \times 10^8$ at 400° C. is used.

In the case of the anisotropic electrically conductive adhesive film, wherein the insulating film 1 has the adhesive characteristics, it is required for the insulating film to have a self-supporting property, an electrical insulating property and the adhesive characteristics by heat-press adhesion, from the point of a heat resistance to heat applied at heat-press adhesion. A thermoplastic polyimide resin having a melt viscosity at 400° C. of not higher than $1 \times 10^8$ poise, and preferably from $1 \times 10^3$ to $1 \times 10^7$ poise, is employed, and if the thermoplastic polyimide resin can satisfy the above-described characteristics, there is no particular restriction on the structure.

If a thermoplastic polyimide resin has a high viscosity such that the melt viscosity at 400° C. exceeds $1 \times 10^8$, the adhesive film cannot sufficiently melt at melt-adhesion to materials to be connected, whereby an ensure connection structure cannot be obtained.

Also, from the point of the heat resistance, the thermoplastic polyimide resin having a glass transition temperature of at least 473K is preferably used.

Specific examples of the thermoplastic polyimide resin which can be used in the present invention are Ultem 1000 (trade name of polyether imide, made by General Electric Co.), LARC-TPI (trade name of polyimide, made by Mitsui Toatsu Chemicals, Inc.), and a polyimide resin obtained from 4,4'-oxydiphthalic acid dianhydride and 3,3'-diaminodiphenylsulfone. Those resins can be used alone or as mixtures thereof.

The thermoplastic polyimide resin may contain, if necessary, additives such as a coloring agent, an adhesive accelerator, an inorganic filler (silica, carbon, etc.), etc., in an optional amount within the range that the properties such as the adhesive property, the heat resistance, etc., of the resin do not deteriorate.

The thickness of the insulating film 1 formed by using such a thermoplastic resin can be optionally selected but from the points of the accuracy (scatter) of the film thickness and the accuracy of the diameter of the through holes formed, the thickness is usually from 5 to 200 μm, and preferably from 10 to 100 μm.

For forming the fine through holes 2 in the insulating film 1, there are a mechanical processing method by punching, etc., a dry etching method by laser, plasma, etc., a chemical wet etching method with a chemical, a solvent, etc. In the case of the etching method, there are a direct etching method of closely placing a mask having desired hole forms such as circles, squares, rhombuses, etc., and treating the insulating film through the mask, a dry etching method of applying laser light focused into spot or focusing laser light onto the film through a mask, and a direct etching method of patterning fine holes using a photosensitive resist and thereafter applying wet etching. In addition, in order to meet the fine patterns of circuits, a dry etching method and a wet etching method are preferred, and in particular, a dry etching method using an abrasion using an ultraviolet laser such as an excimer laser light is preferred since a high aspect ratio is obtained.

For example, in the case of forming fine through holes 2 in the film 1 with a laser light, the diameter of the fine through holes of the film surface at the side of applying a laser light becomes larger than the diameter of the through holes formed at the surface of the opposite side as shown in FIG. 2.

When in FIG. 1 and FIG. 2, the forming angle $\alpha$ of the through hole 2 is selected to be $90°\pm20°$ and the area of the plane form of the through hole 2 is larger than (the thickness of the insulating film)$^2$, the wetting property of the fine hole portions with a plating solution is improved, which results in making filling of a metallic substance effective in the subsequent step.

In the fine through holes 2 formed in the insulating film 1 as described above is filled a metallic substance 3 for forming electroconductive paths and further bump-form metallic projections 4 are formed at both the end portions of each through hole 2.

As such a metallic substance, various kinds of metals such as gold, silver, copper, tin, lead, nickel, cobalt, indium, etc., or various kinds of alloys comprising the above-described metals are used. Since if the purity of the metallic substance is too high, the metallic substance is reluctant to become a bump-form, it is preferred to use the metal or alloy containing a slight amount of an organic material or an inorganic material, which is known for providing such a metallic substance.

For forming the electroconductive path, spattering, various kinds of vapor depositions, and various kinds of platings can be employed. In addition, in the case of employing a plating method, the bump-form metal projections 4 can be grown by prolonging the plating time.

The bump-form metal projections 4 formed at the opening portions of the each through hole 2 described above have a larger base area than the plane area of the opening portion of the through hole 2, preferably at least 1.1 times the latter area. In the present invention, by forming such a large base area of the bump-form metal projections 4, the electroconductive path formed in the through hole 2 does not fall off and has a sufficient strength to a shearing stress in the thickness direction of the insulating film 1, whereby the reliability for the electric connection is improved.

Also, the anisotropic electrically conductive adhesive film of the present invention is electrically connected to materials to be electrically connected by being interposed between the materials and adhered thereto by heat-pressing, etc., and in the case of using the anisotropic electrically conductive adhesive film shown in FIG. 1 or FIG. 2, it is necessary that the metal projections 4,4, which become the connecting contacts are properly deformed by pressing at the connection. Accordingly, it is preferred to use a relatively soft metal such as gold, silver, copper, tin, lead, etc., as the metallic substance being filled in the through holes 2 and further forming the metal projections 4.

As a method of obtaining the anisotropic electrically conductive adhesive film of the present invention using the specific thermoplastic polyimide resin as the insulating film as shown in FIG. 1 and FIG. 2, there is, for example, the method comprising the following steps.

(1) A step of forming fine through holes in the insulating film only of a laminate film of the insulating film and electrically conductive layer(s) (3 layer laminate film through adhesives or 2 layer laminate film directly laminated), or laminating electrically conductive layer(s) on the insulating film having formed therein fine through holes (in this case, however, the electrically conductive layers are laminated such that the fine through holes can pass through the electrically conductive layers or the electrically conductive layers are removed after laminating), after forming a resist layer on the surface(s) of the electrically conductive layer(s) to electrically insulating the surface, etching the through hole portions to form rivet-form groove portions in the electrically conductive layer portions contacted to the through hole portions, (2) a step of filling the fine through holes with a metallic substance by a plating method such as electrolytic plating and electroless plating to form bump-form metal projections, and (3) a step of removing the electrically conductive layer(s) and the resist layer(s) laminated on the insulating film with a chemical etching solution or by electrolytic corrosion.

In addition, the formation of the bump-form metal projections in the step (2) described above may be carried out after the step (3).

In the case of forming the bump-form metal projection on one side of the insulating film in the anisotropic electrically conductive adhesive film of the present invention, it is preferred, to form the bump-form metal projection on the film surface at the side that the diameter of the through hole is smaller as shown in FIG. 2. Accordingly, in the insulating film 1 as shown in FIG. 2, the electrically conductive layer in the step (1) is formed on the side of forming the bump-form metal projection (4) (the lower side in FIG. 2).

For forming the bump-form metal projections, it is preferred that the state of the metal crystal is fine crystal state. In addition, when electrolytic plating is carried out at a high current density, needle-like crystals are formed, whereby it sometimes happens that the bump-form metal projections are not formed. Also, by controlling the deposition rate of the metal crystals or by controlling the kind of the plating solution and/or the temperature of the plating bath, the flat and uniform metal projections can be obtained.

For forming the bump-form metal projections having a larger base area than the area of the opening portions of the through holes such that the bump-form metal projections do not fall off from the insulating film, it is necessary that at the plating, the plated layers are grown higher than the surface of the opening portions of the through holes, that is, the surface of the insulating film, and also are grown to the surface direction from the through holes in a revet form. Since in the anisotropic electrically conductive adhesive film shown in FIG. 1 and FIG. 2, it is necessary that the bump-form metal projections are properly deformed at the connection thereof to materials to be connected, the height of the metal projections is controlled in the range of usually from 2 to 50 $\mu$m, and preferably from 5 to 20 $\mu$m.

Also, in the case of forming the rivet-form bumps by removing the electrically conductive layer at the bottom of the through holes (the case of forming the bumps on both the sides of the through hole), it is preferred that etching of the layer is carried out such that the remaining area is at least 1.1 times the diameter of the through holes. If the diameter of the remaining area of the electrically conductive layer is not less than 1.1 times, it sometimes happens that the effect of the rivet-form bump, that is, the desired effect of preventing the filled metal from falling off from the film, is not obtained.

Figure 3:
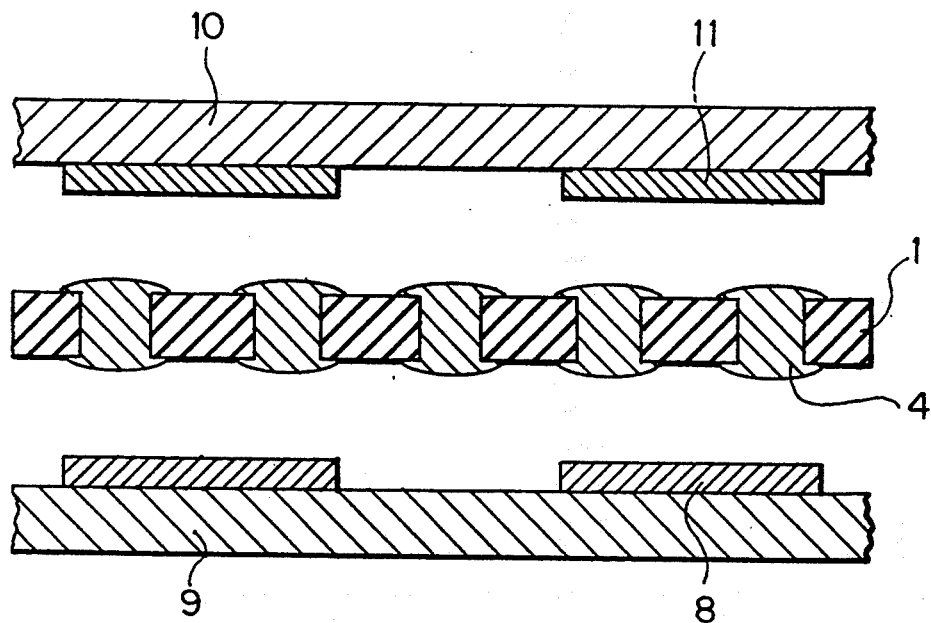
FIG. 3 is a cross sectional view showing a connection structure before mounting a flexible printed substrate on an external circuit substrate using the anisotropic electrically conductive adhesive film of the present invention.
Figure 4:
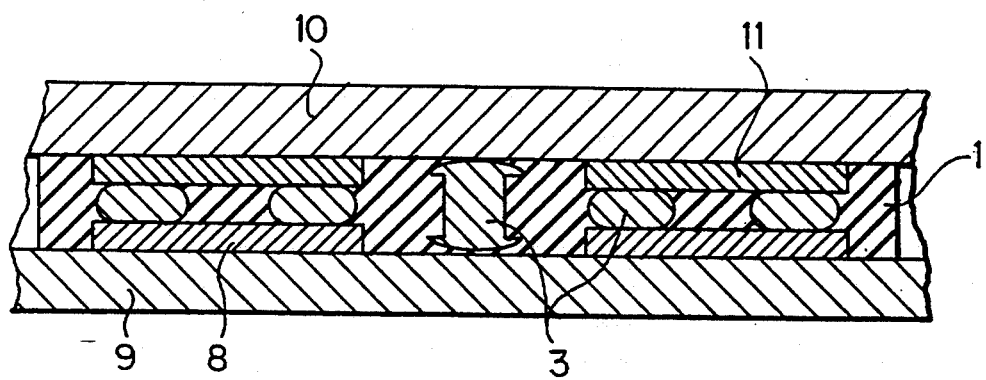
FIG. 4 is a cross sectional view showing a connection structure after mounting a flexible printed substrate on an external circuit substrate using the anisotropic electrically conductive adhesive film of the present invention, FIGS. 5(A) and 5(B) each is an enlarged cross sectional view showing other embodiment of the anisotropic electrically conductive adhesive film of the present invention, sectional.

FIG. 3 and FIG. 4 are cross sectional views showing the connection structures before and after mounting leading portions 11 of a flexible printed circuit (FPC) 10 onto electrodes 8 on a printed circuit substrate 9 using the anisotropic electrically conductive film of the present invention shown in FIG. 1. In the case of using, for example, polyether imide (Ultem 1000, trade name, made by General Electric Co.) as the thermoplastic polyimide resin, by adhering them by hot pressing for about 10 minutes under the conditions of 320° C. and 10 kg/cm$^2$, the connected structure as shown in FIG. 4 is obtained.

Also, in the present invention, the connection of the anisotropic electrically conductive adhesive film with materials to be connected is ensured by the heat adhesive characteristics of the thermoplastic polyimide resin forming the insulating film 1 but if necessary, by injecting a heat adhesive resin or by interposing a heat adhesive resin film between the material to be connected and the anisotropic electrically conductive film, the connection can be more ensured.

Examples of the materials to be connected are flexible printed substrates, external circuit substrates, semiconductor elements, multilayer circuit substrates, multi-tip modules, electronic parts and leading frames.

Furthermore, the present invention also provides an anisotropic electrically conductive adhesive film wherein a thermoplastic polyimide resin layer having a melt viscosity at 400° C. of not higher than $1 \times 10^8$ is formed at least one surface of the anisotropic electrically conductive film disclosed in JP-A-3-266306 in addition to the anisotropic electrically conductive film of the above-described embodiment.

FIG. 5 and FIG. 6 are enlarged cross sectional views showing other embodiments of the anisotropic electrically conductive adhesive film of the present invention as described above.

In the anisotropic electrically conductive adhesive films shown in FIG. 5 and FIG. 6, the insulating film 1 itself does not have an adhesive property but a thermoplastic polyimide resin layer 5 is formed on both the surfaces (the front and back surfaces) of the insulating film 1, and the thermoplastic polyimide resin layers adhere by heating to materials to be connected to give the effect of sealing the connected portion. In addition, in the present invention, the thermoplastic polyimide layer 5 may be formed on surface only of the insulating film 1 (not shown).

Figure 5A:
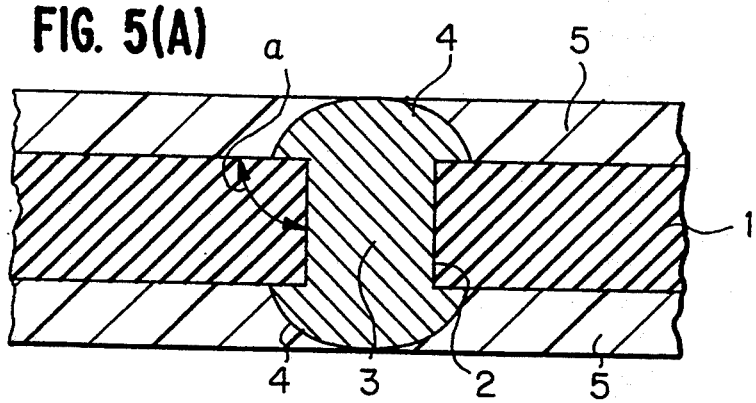
Figure 5B:
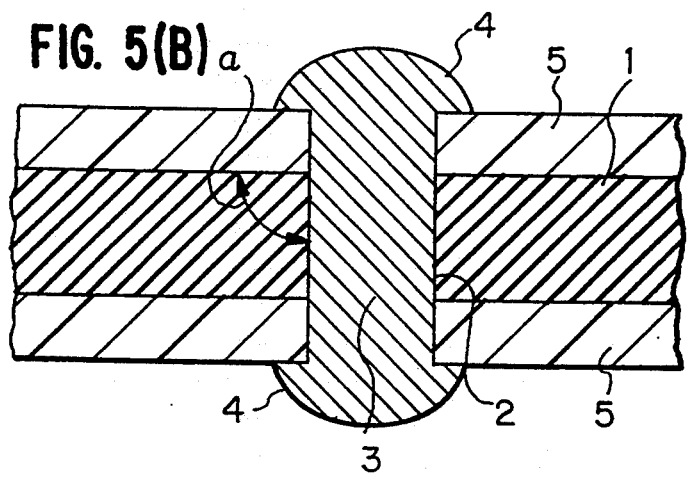

Also, FIG. 5(A) shows the case that the thermoplastic polyimide layers 5,5 are formed such that the layers cover wholly the bump-form metal projections 4,4 and FIG. 5(B) shows the case that the thermoplastic polyimide resin layers 5,5 are previously formed on both the surfaces of the insulating film 1, fine through holes 2 are formed through the insulating film 1 and the thermoplastic polyimide resin layers 5,5, and a metallic substance 3 is filled in the through holes 2 such that the metal projections 4,4 are exposed on the front and back surfaces to form electroconductive paths.

Figure 6A:
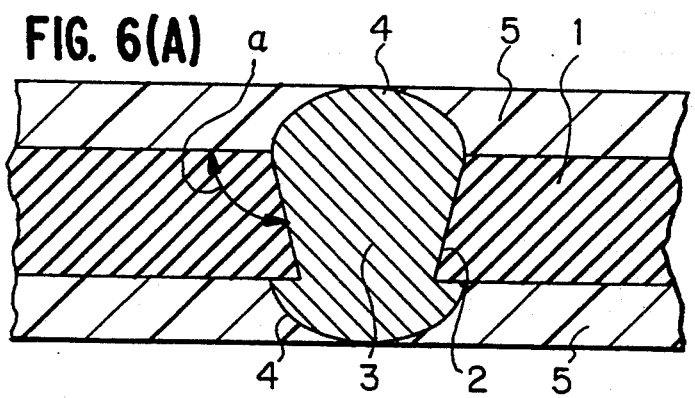
FIG. 6(A) and 6(B) each is enlarged cross sectional view shoeing still another embodiment of the anisotropic electrically conductive adhesive film of the present invention.
Figure 6B:
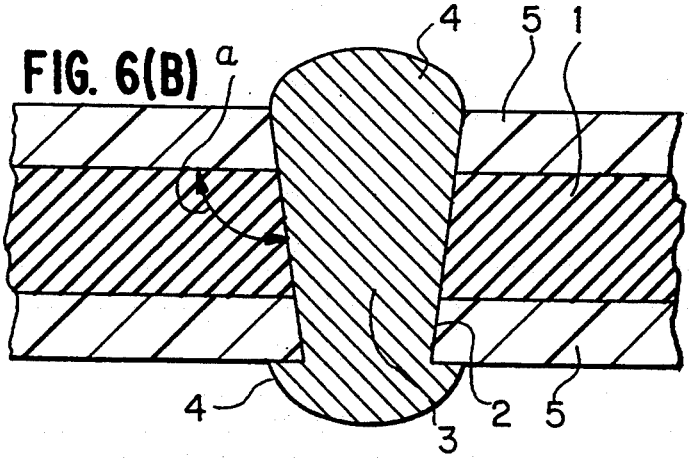

FIG. 6(A) and FIG. 6(B) are enlarged cross sectional views showing other embodiments of the anisotropic electrically conductive adhesive film of the present invention, wherein the bump-form metal projection 4 having a larger base area than the area of the opening portion of a through hole 2 formed in the insulating film 1 is formed at the one end portion only of the through hole 2 and a thermoplastic polyimide resin layer 5 is formed on both the surfaces of the insulating film 1 as the embodiments shown in FIG. 5. FIG. 6(A) and (B) show the formation states of the thermoplastic polyimide resin layers 5,5 (the non-exposed state and the exposed state of the metal projections) corresponding to the formation states shown in FIG. 5(A) and (B), respectively.

The diameter of the fine through holes in FIG. 6 can be selected according to the purpose of use as described above.

There is no particular restriction on the insulating film 1 in the anisotropic electrically conductive adhesive films of the present invention shown in FIG. 5 and FIG. 6 if the film has a self-supporting property and an electric insulating property, and thermosetting resins and thermoplastic resins such as polyester series resins, epoxy series resins, urethane series resins, polystyrene series resins, polyethylene series resins, polyamide series resins, polyimide series resins, ABS resins, polycarbonate resins, silicone series resins, etc., can be selectively used according to the purpose. In those resins, heat resistant resins such as polyimide, polyether sulfone, polyphenylene sulfone, etc., can be used as the resin having a high heat resistance, and the use of the polyimide resin is particularly preferred.

The thickness of the insulating film can be optionally selected but is usually from 5 to 200 μm, and preferably from 10 to 100 μm from the points of the accuracy (scatter) of the film thickness and the accuracy of the diameter of the through holes.

The thermoplastic polyimide resin layer 5 formed on at least one surface of the insulating film described above is for temporarily adhering the anisotropic electrically conductive adhesive film of the present invention to material(s) to be connected and resin-sealing the connected portions, and the same resins as the above-described thermoplastic polyimide resins are used.

In the case of using semiconductor element(s) as material(s) to be connected, for improving the adhesion between the thermoplastic polyimide resin layer 5 and the semiconductor element, it is preferred that a silane coupling agent or a silane compound is incorporated in the thermoplastic polyimide resin layer 5 or coated on the surface of the layer 5.

There is no particular restriction on the thickness of the thermoplastic polyimide resin layer 5 but the thickness is usually from 3 to 500 μm, and preferably from 5 to 100 μm from the points of the accuracy (scatter) of the thickness and the reliability for the connection.

As a method of obtaining the anisotropic electrically conductive adhesive films shown in FIG. 5 and FIG. 6 described above, there is a method comprising, for example, the following steps:

(1) A step of laminating an electrically conductive layer on the opposite surface of an insulating film to the surface thereof having laminated thereon a thermoplastic polyimide resin layer with or without using an adhesive and forming fine through holes in the insulating film and the thermoplastic polyimide resin layer, or laminating an electrically conductive layer on a laminate film of an insulating film and a thermoplastic polyimide resin layer having formed in the laminate film fine through holes (in this case, however, the electrically conductive layer is laminated such that the fine through holes pass through or is removed after laminating), after forming a resist layer on the surface of the electrically conductive layer to insulate the surface thereof, etching through hole portions to form rivet-form groove portions in the electrically conductive layer portions contacted with the through hole portions, (2) a step of filling the fine through holes with a metallic substance by a plating method such as an electrolytic plating method and a electroless plating method to form bump-form metal projections, and (3) a step of removing the electrically conductive layer laminated on the insulating film with a chemical etching solution or by an electrolytic corrosion.

In addition, the thermoplastic polyimide resin layer in the step (1) may be laminated on the insulating film after the step (3) without being previously laminated on the insulating film.

The formation of the bump-form metal projections in the step (2) may be carried out after the step (3) and for preventing the surface (exposed side) of the thermoplastic polyimide resin layer from staining after the step (3), it is preferred that the thermoplastic polyimide layer is covered with a separator during storing.

In addition, the formation method and the form of the bump-form metal projections are the same as the cases in FIG. 1 and FIG. 2 described above. Furthermore, in the cases of FIG. 5 and FIG. 6, it is unnecessary that the metal projections 4 are deformed at the connection with materials to be connected, and hence the height of the metal projections is in the range of usually 5 μm or larger, and preferably from 5 to 100 μm.

Figure 7:
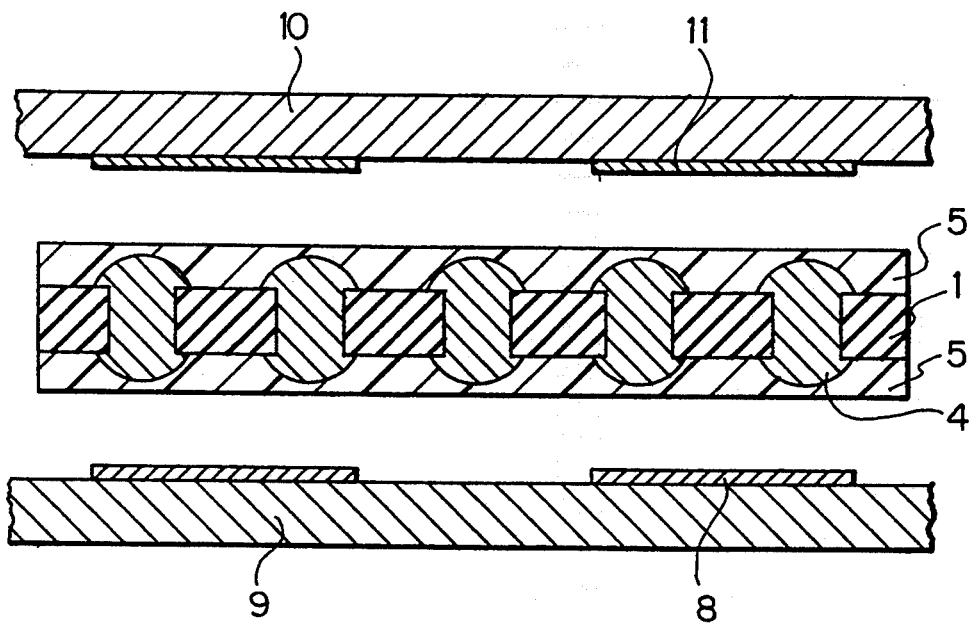
FIG. 7 is a cross sectional view showing a connection structure before mounting a flexible printed substrate on an external circuit substrate using the anisotropic electrically conductive adhesive film of the present invention shown in FIG. 5(A)
Figure 8:
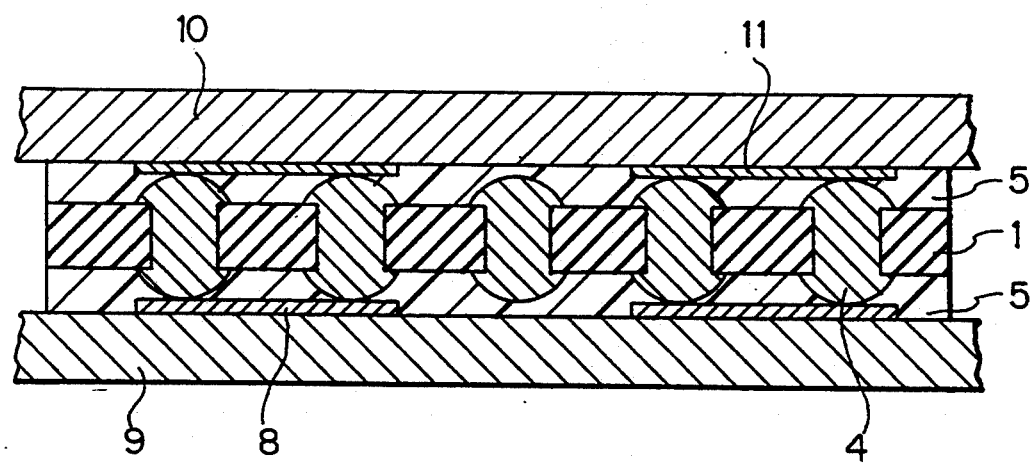
FIG. 8 is a cross sectional view showing a connection structure after mounting a flexible printed substrate on an external circuit substrate using the anisotropic electrically conductive adhesive film of the present invention shown in FIG. 5(A)

FIG. 7 and FIG. 8 are cross sectional views showing the connection structures before and after mounting the leading portions 11 of a flexible printing substrate (FPC) onto the electrodes 8 of a printing circuit substrate 9 using the anisotropic electrically conductive film shown in FIG. 5(A) as same as in FIG. 3 and FIG. 4 described above. When, for example, polyether imide (Ultem 1000, trade name, made by General Electric Co.) is used as the thermoplastic polyimide resin, by adhering under heating using the anisotropic electrically conductive adhesive film by hot pressing for about 10 minutes under the conditions of 320° C. and 10 kg/cm$^2$, the connected structure as shown in FIG. 8 is obtained.

The present invention is explained below more practically by the following examples.

EXAMPLE 1

A dioxane solution of 20% by weight of polyether imide (Ultem 1000, trade name, made by General Electric Co., the melt viscosity at 400° C.: $8 \times 10^3$ poise, the glass transition temperature: 478K) was coated on a copper foil at a dry thickness of 1 mil followed by drying to provide a double layer film of the copper foil and the polyether imide film.

Dry etching was applied to the polyether imide film thus formed by irradiating the surface of the film with KrF excimer laser light having an oscillation wavelength of 248 nm through a mask to form a region of 8 cm$^2$ having fine through holes having diameter of 60 μm and at a pitch of 200 μm and at 5 holes/mm at the polyimide film layer.

A resist was coated on the surface of the copper foil and hardened to insulate the copper foil surface, and the laminated film was immersed in a chemical etching solution for 2 minutes at 50° C.

After washing the laminated film with water, the copper foil portion was connected to an electrode, the laminated film was immersed in a gold cyanide plating bath at 60° C., gold plating was grown at the through hole portions of the double layer film using the copper foil as the cathode, and when the gold crystal slightly projected (projected height of 5 μm) from the surface of the polyimide film, the plating treatment was stopped.

The resist layer coated was peeled off and the copper foil of the double layer film was dissolved off with an aqueous ferric chloride solution to provide the anisotropic electrically conductive adhesive film of the present invention.

EXAMPLE 2

An aqueous solution of a polyimide precursor synthesized from 3,3',4,4'-biphenyltetracarboxylic acid dianhydride and para-phenylenediamine was coated on a copper foil at a dry thickness of 1 mil and hardened to provide a double layer film of the copper foil and the polyimide film.

Dry etching was applied to the polyimide film by irradiating the surface of the polyimide film with KrF excimer laser light having an oscillation wavelength of 248 nm through a mask to form a region of 8 cm$^2$ of fine through holes having a diameter of 60 μm at a pitch of 200 μm and at 5 holes/mm. A resist was coated on the surface of the copper foil, and hardened to insulate the surface, and the laminated film was then immersed in a chemical etching solution for 2 minutes at 50° C.

After washing the laminated film with water, the copper foil portion was connected to an electrode, the laminated film was immersed in a gold cyanide plating bath at 60° C., and gold plating was grown at the through hole portions of the double layer film using the copper foil as the cathode. When the gold crystal slightly projected (projected height of 5 μm) from the surface of the polyimide film, the plating treatment was stopped. The resist layer coated was peeled off and the copper foil of the double layer film was dissolved off with an aqueous ferric chloride solution.

Finally, a thermoplastic polyimide resin layer (the melt viscosity at 400° C. of $8.3 \times 10^5$ poise, the glass transition point of 451K) composed of LARC-TPI (trade name of polyimide, made by Mitsui Toatsu Chemicals, Inc.) was formed on one surface or both the surfaces of the insulating film to provide the anisotropic electrically conductive film.

While the invention has been described in detail and with reference to specific embodiments thereof, it will be apparent to one skilled in the art that various changes and modifications can be made therein without departing from the spirit and scope thereof.

What is claimed is:

1. An anisotropic electrically conductive adhesive film having fine through holes whereby each through hole electroconductively passes through a front surface and a back surface of an insulating film in the thickness direction, and at least one end portion of each through hole on the front and back surfaces of said insulating film is blocked with a bump-form metal projection having a base area at each end, said base area having a larger area than the plane area of the opening portion located at an end portion of the through hole, wherein the insulating film comprises a thermoplastic polyimide resin having a melt viscosity at 400° C. of not higher than $1 \times 10^8$ poise.

2. The anisotropic electrically conductive adhesive film of claim 1, wherein the fine through holes are formed by irradiation of a laser light.

3. The anisotropic electrically conductive adhesive film of claim 1, wherein the base area of the bump-form metal projections is larger than 1.1 times the plane area of the through holes.

4. The anisotropic electrically conductive adhesive film of claim 1, wherein the plane area of the through holes is larger than the square of the thickness of the insulating film.

5. The anisotropic electrically conductive adhesive film of claim 1, wherein the melt viscosity of the thermoplastic polyimide resin is from $1 \times 10^3$ to $1 \times 10^7$ poise.

6. The anisotropic electrically conductive adhesive film of claim 1, wherein the glass transition temperature of the thermoplastic polyimide resin is at least 475K.

7. A connection structure comprising the anisotropic electrically conductive adhesive film of claim 1 and materials to be electrically connected, wherein said anisotropic electrically conductive adhesive film is interposed between the materials to be electrically connected.

8. The connection structure of claim 7, wherein the materials to be electrically connected are selected from flexible printed substrates, external circuit substrates, semiconductor elements, multilayer circuit substrates, multi-tip modules, electronic parts, and lead frames.

9. An anisotropic electrically conductive adhesive film having fine through holes whereby each through hole electroconductively passes through a front surface and a back surface of an insulating film in the thickness direction, and at least one end portion of each through hole on the front and back surfaces of said insulating film is blocked with a bump-form metal projection having a base area at each end, said base area having a larger area than the plane area of the opening portion located at an end portion of the through hole, wherein a thermoplastic polyimide resin layer having a melt viscosity at 400° C. of not higher than $1 \times 10^8$ poise is formed on at least one surface of the insulating film.

10. The anisotropic electrically conductive adhesive film of claim 9, wherein the fine through holes are formed by irradiation of a laser light.

11. The anisotropic electrically conductive adhesive film of claim 9, wherein the base area of the bump-form metal projection is larger than 1.1 times the plane area of the through holes.

12. The anisotropic electrically conductive adhesive film of claim 9, wherein the plane area of the through holes is larger than (the thickness of the insulating film)$^2$.

13. The anisotropic electrically conductive adhesive film of claim 9, wherein the melt viscosity of the thermoplastic polyimide resin is from $1 \times 10^3$ to $1 \times 10^7$ poise.

14. The anisotropic electrically conductive adhesive film of claim 9, wherein the glass transition temperature of the thermoplastic polyimide resin is at least 475K.

15. A connection structure comprising the anisotropic electrically conductive adhesive film of claim 9 and materials to be electrically connected, wherein the anisotropic electrically conductive adhesive film is interposed between the materials to be electrically connected.

16. The connection structure of claim 15, wherein the materials to be electrically connected are selected from flexible printed substrates, external circuit substrates, semiconductor elements, multilayer circuit substrates, multi-tip modules, electronic parts, and lead frames.

* * * * *